United States Patent [19]

Jochym

[11] 4,409,278

[45] Oct. 11, 1983

[54] BLISTER-FREE DIRECT BONDING OF METALS TO CERAMICS AND METALS

[75] Inventor: Eric P. Jochym, Baldwinsville, N.Y.

[73] Assignee: General Electric Company, Schenectady, N.Y.

[21] Appl. No.: 254,840

[22] Filed: Apr. 16, 1981

[51] Int. Cl.³ .............................................. B23K 1/12
[52] U.S. Cl. .................................. 428/163; 228/124; 228/174; 228/198; 428/167; 428/178; 428/577; 428/586; 428/675
[58] Field of Search ............... 228/124, 165, 170, 174, 228/198, 258; 428/163, 167, 178, 182, 188, 577, 586, 675, 471

[56] References Cited

U.S. PATENT DOCUMENTS

| | | | |
|---|---|---|---|
| 3,284,176 | 11/1966 | Reed et al. | 228/174 X |
| 3,337,947 | 8/1967 | Terrill et al. | 228/165 |
| 3,541,225 | 11/1970 | Raciti | 228/258 X |
| 3,766,634 | 10/1973 | Babcock et al. | 228/188 |
| 3,911,553 | 10/1975 | Burgess et al. | 228/903 |
| 3,994,430 | 11/1976 | Cusano et al. | 228/122 |
| 4,061,263 | 12/1977 | Ohlstein | 228/170 X |

FOREIGN PATENT DOCUMENTS 1127179 4/1962 Fed. Rep. of Germany ...... 228/165

OTHER PUBLICATIONS

Sun et al, Article in *IEEE Transactions on Electron Devices*, vol. ED-23, No. 8, Aug. 1976, pp. 961-967.

*Primary Examiner*—Kenneth J. Ramsey
*Attorney, Agent, or Firm*—Charles E. Bruzga; James C. Davis, Jr.; Marvin Snyder

[57] ABSTRACT

Large-area, blister-free assemblies of direct-bonded metal to a ceramic or metal substrate are obtained by providing venting channels in the metal-substrate interface. The channels may be formed in the metal or substrate surface to be bonded. The channels in the metal may be formed by etching, while the channels in the ceramic may be formed by mechanical techniques, such as grinding. The metal-to-substrate direct bond may be formed by any conventional processes employing an eutectic melt composition to bond the metal to the substrate.

32 Claims, 9 Drawing Figures

BLISTER-FREE DIRECT BONDING OF METALS TO CERAMICS AND METALS

This application is related to co-pending application Ser. No. 254,841 filed Apr. 16, 1981 and assigned to the same assignee as the present invention.

BACKGROUND OF THE INVENTION

The present invention relates to direct bonding of a metal to a metal or ceramic substrate. More specifically, the invention relates to a method of fabricating large area, blister-free assemblies of metal direct bonded to a variety of metallic and ceramic substrates.

U.S. Pat. Nos. 3,766,634 issued Oct. 23, 1973 to G. L. Babcock et al and 3,994,430 issued Nov. 30, 1976 to D. A. Cusano et al (both assigned to the same assignee as the present invention) describe several methods of direct bonding metallic and non-metallic refractory materials to metals which are useful in the fabrication of integrated circuit modules, and in providing current carrying electrical conductors on insulating substrates with high thermal conductivity paths to a heat sink. Examples of specific applications of direct-bonded metal-ceramic assemblies are provided in the aforementioned patent to D. A. Cusano et al. The application of assemblies made up of direct-bonded metal to ceramic in hybrid, high power electronic circuits is described by Y. S. Sun and J. C. Driscoll in "A New Hybrid Power Technique Utilizing a Direct Copper to Ceramic Bond", IEEE Transactions on Electron Devices, V. ED-23, No. 8, August 1976.

In the past, "thick-film" and moly-manganese processes have been among the methods employed to bond metal to ceramic. These methods typically require formation of an intermediate bonding layer at the metal-ceramic boundary. The metal-ceramic assemblies made by these methods are, however, unsatisfactory for high power and/or high frequency applications due, in part, to the low electrical and thermal conductivities of the intermediate layer. The assemblies are unsuitable for high frequency use because of such frequencies current flows in the high resistance intermediate layer at the metal ceramic interface. Additionally, the high thermal impedance of the intermediate layer diminishes the ability to dissipate heat in the substrate. Moreover, the conductive metal layer fabricated in accordance with these methods is typically less than 0.001 inch thick, thus severely limiting the usefulness of the assembly in applications wherein high current surges occur. Typically, the thin conductive layer must be built up by electrodeposition of additional metal.

Direct-bonded metal to ceramic is particularly useful in high power and high frequency applications. The eutectic metal-to-ceramic bond (to be more fully described hereinafter) is characterized by the absence of a readily identifiable intermediate layer at the metal-ceramic interface. The absence of the intermediate layer provides good electrical and thermal conductivity at the metal-ceramic junction. Good electrical conductivity in this region permits satisfactory high frequency operation, while good thermal conductivity allows the use of the ceramic for direct heat-sinking. Beryllia (BeO), which is the only material other than diamond that combines high thermal conductivity with superior electrical insulating qualities, is a particularly useful ceramic for applications requiring high heat dissipation. Direct bonding methods also permit bonding of metals of substantially greater thickness. For instance, copper material having a thickness as great as 0.25 inch has been successfully direct-bonded to beryllia.

A drawback associated with direct bonded assemblies fabricated by direct bonding methods is that large area metal-substrate bonds cannot be reproducibly formed without the occurrence of blisters in the metal-substrate interface. The cause of the blistering phenomenon is not completely understood, but is believed to be due to entrapment of gases, or evolution of gases from contaminants during the direct bonding operation. Generally, the substrate area to which metal can be reproducibly direct-bonded without blistering is limited to less than one square inch. The blistered areas present an uneven metal surface which is not sufficiently flat for reliably soldering electronic components thereon and thus must be sanded or filed to the required flatness. Moreover, since there is a bonding discontinuity at the metal-substrate interface, where blisters appear, thermal dissipation through the assembly is decreased. The reliability of electrical contacts is also decreased, since during thermal cycling solder joints which connect electronic components to the copper foil may fracture due to uneven expansion or contraction of the copper in the region of bond discontinuity compared to unblistered assembly portions.

The present invention provides a method for reproducibly direct bonding large area metallic members to a variety of substrates without blisters. The metal bonds intimately to the substrate, providing a flat surface for soldering electronic components. The intimate metal-to-substrate bond permits superior thermal dissipation and electrical conduction. Blister-free, direct bonded, metal-to-ceramic assemblies as large as 2×2 inches have been produced by the method of the present invention. Larger areas assemblies may be produced if desired.

SUMMARY OF THE INVENTION

In accordance with the present invention large area, blister-free assemblies of metal direct-bonded to a metal or ceramic substrate are fabricated by providing gas venting channels in at least one of the surfaces forming the metal-substrate interface. The channels may be ground in the ceramic substrate surface, but are most conveniently etched in the the metallic member. The channels may assume any convenient configuration, provided sufficient uniformity and density is maintained to allow venting of the entire metal-substrate interface. Channel dimensions are not critical. Parallel channels, etched in a 2×2 inch piece of 0.010 inch thick copper foil, having a width of 0.005 inches and a depth of 0.001–0.0015 inch and separated by 0.025 inch, produce satisfactory blister-free assemblies. The metal may be direct bonded to the substrate by any of the conventional direct-bonding processes employing an eutectic melt. The details of such processes are described, for example, in the aforementioned U.S. Pat. No. 3,766,634 and 3,994,430 which are hereby incorporated by reference in the present application.

It is an object of the invention to provide a method for reproducibly fabricating large-area, blister-free assemblies of metal direct bonded to a metal or ceramic substrate.

It is another object of the invention to produce the aforementioned large-area, blister-free assemblies by providing venting channels in the metal and/or the substrate to provide outlet means for gases trapped or evolved at the metal-substrate interface.

It is still another object of the present invention to provide a direct-bonded metal-substrate assembly having a flat surface for conveniently soldering electrical components thereon.

It is a further object of the invention to provide a direct-bonded, metal-substrate assembly exhibiting superior thermal and electrical conductivities at the metal-substrate interface.

BRIEF DESCRIPTION OF THE DRAWINGS

The features of the invention believed to be novel are set forth with particularly in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1A:
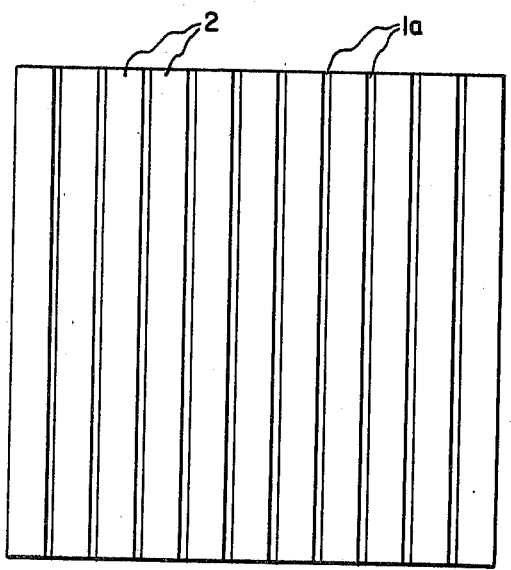
FIG. 1a and FIG. 1b, respectively, are plan views of exemplary channel patterns suitable for etching or grinding in the metal and/or ceramic surfaces to be bonded.
Figure 1B:
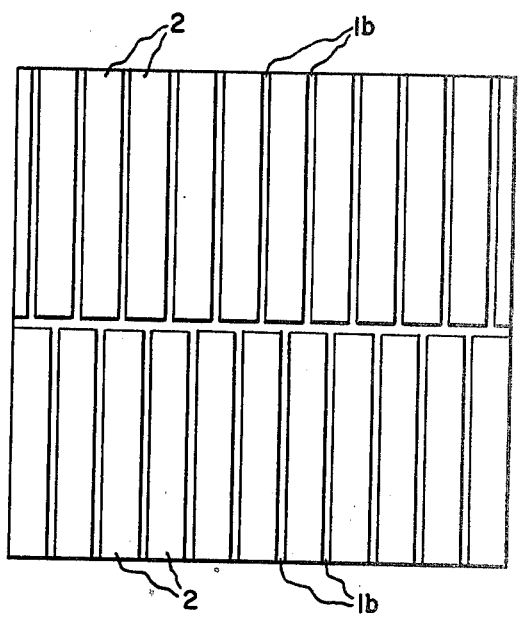

FIGS. 1a and 1b depict two exemplary channel patterns composed of a plurality of channels 1a and 1b, respectively, which may be formed in the metal and/or ceramic surface to be bonded. The particular channel pattern or configuration employed is not critical. Thus, although any convenient channel pattern may be used, some criteria must still be observed. For example, a sufficient number of channels must be formed and the channels spaced to provide venting of the entire metal-substrate interface. Channel depth and width are dependent on the properties of the particular metal or substrate employed. Generally, the channels must be sufficiently large to provide adequate venting without weakening the structure of the assembly. Thus, if the channels are too wide or too deep, the material may not retain sufficient structural strength to avoid undesirable sagging or melting at high temperature. Additionally, adequate spaces 2 must be provided between adjacent channels (1a or 1b) to ensure adequate bonding area between the metal and substrate. The dimension of the bonding area is also important, since adequate contact area between the metallic member 3 and the substrate 4 (shown in FIGS. 2a-2b, 3a-3b, and 4a-4b, described below) must be provided to ensure adequate heat dissipation. By way of example, and not limitation, for the pattern illustrated in FIG. 1a, channels having a width of 0.005 inch, a depth of between 0.001 and 0.0015 inch, and etched 0.025 inch apart have been found satisfactory for copper foil 0.010 inch thick and 2 inches square.

Figure 2A:
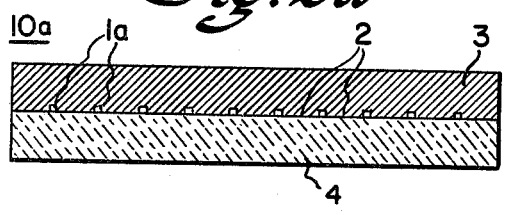
FIGS. 2a and 2b are cross-sectional views of an assembly in accordance with the present invention, in which a metallic member is direct bonded to a ceramic substrate, and wherein the channels are formed in the metallic member and in the ceramic substrate, respectively.
Figure 2B:
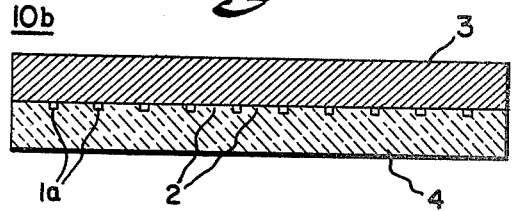

FIG. 2a and FIG. 2b illustrate assemblies 10a and 10b, respectively, made up of a metallic member 3 direct bonded at a plurality of inter-channel regions 2 to a ceramic substrate 4. In FIG. 2a, a plurality of channels 1a, similar to those shown in FIG. 1a, for example, are formed in the metallic member. The channels span the entire width of the assembly and provide means for venting gases from the metallic member-ceramic substrate interface. FIG. 2b illustrates an assembly 10b, similar to assembly 10a depicted in FIG. 2a, but wherein channels 1a are formed in ceramic substrate 4.

Figure 3A:
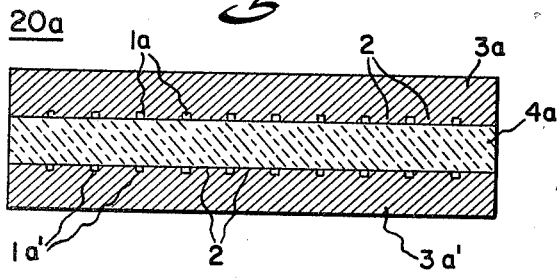
FIGS. 3a and 3b are cross-sectional views, respectively, of another assembly in accordance with the present invention wherein a metallic member is direct bonded to each major surface of a ceramic substrate, and wherein the channels are formed in the inner surfaces of each of the metallic members or on both major surfaces of the ceramic substrate, respectively.
Figure 3B:
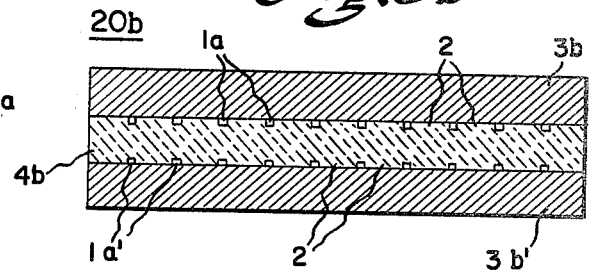

FIG. 3a and FIG. 3b illustrate assemblies 20a and 20b, respectively, similar to those illustrated in FIGS. 2a and 2b but with additional metallic members 3a' and 3b' bonded to the outer surfaces of metallic members 4a and 4b, respectively. In assembly 20a, shown in FIG. 3a, channels 1a are formed in the surfaces of ceramic substrates 3a and 3a', respectively, disposed adjacent to ceramic substrate 4a. Channels 1a, in assembly 20b, are formed on each major surface of ceramic substrate 4b. Assemblies 20a and 20b may be employed in applications requiring, for example, electronic components to be mounted on each side of the same assembly.

Figure 4A:
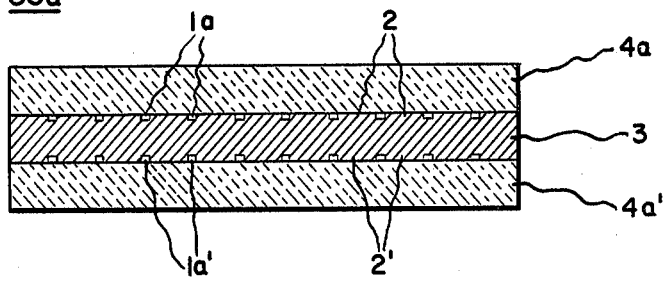
FIGS. 4a and 4b are cross-sectional views of assemblies similar to those of FIGS. 3a and 3b, respectively, but wherein two ceramic substrates are bonded to each major surface of a metallic member.
Figure 4B:
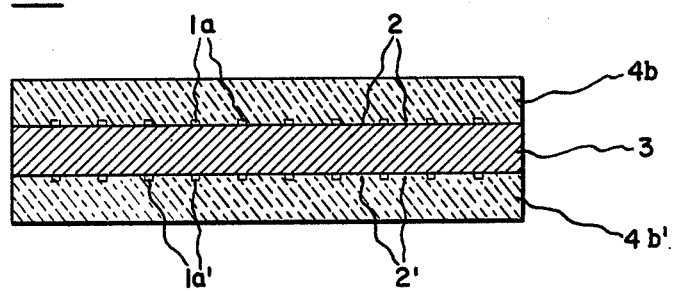

A pair of assemblies 30a and 30b, depicted in FIG. 4a and FIG. 4b, respectively, illustrate a method of bonding two ceramic substrates. In FIG. 4a, ceramic substrates 4a and 4a' bonded to each major surface of a metallic member 3 having channels 1a formed in each major surface thereof. In assembly 30b, shown in FIG. 4b, the channels are formed in the inner surfaces of ceramic substrates 4b and 4b', respectively. Assemblies 30a and 30b are useful in fabricating hermetic seals between non-metallic refractory materials, for instance, such as those employed in the fabrication of vacuum tubes, particularly high frequency electron tubes.

Figure 5:
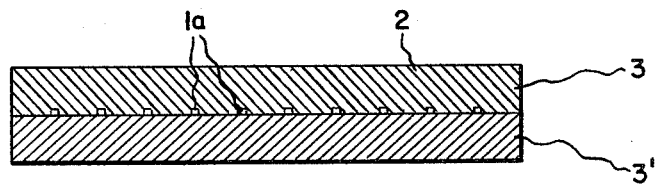
FIG. 5 is a cross-sectional view of an assembly wherein two metallic members are direct bonded to one another.

FIG. 5 illustrates metallic members 3 and 3' bonded to one another. Although channels 1a are shown formed in metallic member 3, it is readily apparent that they may also be formed in metallic member 3'.

It should be noted that although the present invention has been described with reference to the exemplary configurations illustrated in FIG. 2-FIG. 5, the invention may also be advantageously practiced with other configurations. In the assembly illustrated in FIG. 2a, for example, some of channels 1a may be formed in metallic member 3, as shown, while the remaining channels 1a (not shown) may be formed in substrate 4. Similarly, in FIG. 3a, channels 1a' may be formed in ceramic substrate 4a. The suggested modifications are merely exemplary and others will occur to those skilled in the art.

Although channels 1a and 1b (FIGS. 1a and 1b, respectively) may be formed by mechanical means, such as grinding, it is substantially more convenient and economical to etch the channels in the metal. The etching techniques may be similar to those frequently employed to photoetch copper-clad printed circuit boards. The method described below is useful in etching copper. However, the general principles are applicable to etching other metals.

Generally, in photoetching, a photosensitive film is applied to the metallic member to be etched. A photographic negative of the desired pattern, such as illustrated in FIG. 1a or FIG. 1b, is superimposed on the sensitized film and the film exposed to ultraviolet light. Since portions of the negative pattern depicting channels 1a or 1b are opaque to ultraviolet light, the corresponding portions of the sensitized film remain unexposed and are easily dissolved with a solvent, such as alcohol, thus baring the metal. The exposed portions of the film harden and protect the metal during the etching operation. By contacting the bared metal to an etchant, such as nitric acid or ferric chloride, for predetermined periods of time, the quantity of metal removed, and hence the channel depth, may be controlled. In the final step, the hardened film is dissolved.

In accordance with an alternative process, an etchant-resistant pattern may be formed on the metal by silk screening a thermally cured ink, such as Screen Resist-2005 available from Dynakem Corporation (Santa Ana, Calif.). Following a drying step, the exposed metal portions may be etched as described above. This process, known as stencil etching, is not as well suited for etching patterns having very fine detail.

The ceramic substrate preferably constitutes a material having high electrical resistivity and thermal conductivity. Alumina ($Al_2O_3$) is suitable for low power applications. The electrical resistivity and thermal conductivity of beryllia (BeO), however, are far superior to that of alumina and its lower dielectric constant is an advantage in some applications. For example, due to the decreased probability of dielectric breakdown and circuit overheating, beryllia is preferred for aplications requiring high density arrays of active circuits. Other ceramics to which metals may be direct bonded include silicon dioxide ($SiO_2$), zinc oxide (ZnO), and barium titanate ($BaTiO_3$). In typical electrical applications, ceramic substrates having a thickness of 0.010-0.040 are employed.

Although copper having a thickness as high as 0.25 inch has been direct bonded to, for example, beryllia ceramic 0.020-0.025 inch thick, copper foil 0.010 inch thick is satisfactory for many electrical applications. The exact thickness depends on the required current carrying capacity.

The direct bonding process by which the invention may be advantageously practiced is characterized by the absence of a readily identifiable intermediate phase between the metal and the ceramic. It does not, however, exclude the presence of a transition layer one or two monolayers thick, such as, for example, oxygen bridges (if oxygen is used to form the eutectic) between the metal and ceramic. Satisfactory direct bonding of a metal to ceramic requires intimate contact between metal and ceramic. This may be achieved by bringing the metal to a liquid state by melting without the aid of an eutectic. The liquified metal replicates the ceramic surface where it wets and, if a strong bond is formed, good adhesion is obtained after cooldown. The difficulty with this approach is that if too much metal liquifies, the metal member (and hence the venting channels) loses its dimensional configuration.

This difficulty may be avoided by employing an eutectic composition to direct bond the metallic member to a metal or ceramic substrate. The eutectic or eutectic composition is a mixture of the atoms of the metallic member and the reactive gas or component formed between the metal and the reactive gas (bonding agent). Useful metallic materials include copper, nickel, cobalt, silver, and iron, for example. Useful reactive gases may include oxygen, phosphorus-bearing compounds, and sulfur-bearing compounds. Briefly, the requirement is to form a thin eutectic layer on the metal to be bonded. It is essential that the liquifying point (melting point) of the eutectic layer occur at a somewhat lower temperature than the liquifying point (melt point) of the metal. In this manner, the eutectic layer may be liquified, allowing it to wet the ceramic, while the metal to be bonded becomes slightly pliant and complies to the general surface contour of the substrate without losing its configuration. The predominant constituent of the eutectic layer should be the same element that makes up the metallic member, and any additional constituent should be present in only small amounts or be easily removable after bonding. This is important in order to preserve the electrical and thermal conductivity properties at the metal-substrate interface. The thickness of the eutectic layer must be kept small in comparison to the thickness of the member to be bonded.

Such an eutectic exists, for example, between copper and oxygen and is commonly referred to as $Cu-Cu_2O$ eutectic. The melting point of this eutectic is 1065° C., compared to 1083° C. for pure copper. If the copper foil surface having channels etched therein and an eutectic formed thereon (as will be described hereinafter) is brought in contact with a substrate, as illustrated in FIGS. 2a or 2b, and heated to a temperature of between 1065° C. and 1083° C., the eutectic layer liquifies and wets the ceramic to form a bond upon cooling. The copper-oxygen eutectic layer, in effect, acts as a glue to bond the copper member to the ceramic without the copper member losing its dimensional configuration. Table I lists examples of the other gas-metal eutectics as well as other properties thereof.

TABLE I

| Metal-Gas Eutectics for Direct Bonding | | | |
|---|---|---|---|
| Metal-Gas Eutectic | Eutectic Temperature (°C.) | Percent by Weight of Reactive Gas at Eutectic Temperature | Melting Point of Metal |
| copper-oxygen | 1065 | 0.39 $O_2$ | 1083 |
| iron-oxygen | 1523 | 0.16 $O_2$ | 1535 |
| nickel-oxygen | 1438 | 0.24 $O_2$ | 1452 |
| cobalt-oxygen | 1451 | 0.23 $O_2$ | 1480 |
| copper-sulfur | 1067 | 0.77 S | 1083 |
| silver-sulfur | 906 | 1.8 S | 960 |
| chromium-sulfur | 1550 | 2.2 S | 1615 |
| silver-phosphorous | 878 | 1.0 P | 960 |
| nickel-phosphorous | 714 | 11.0 P | 1452 |
| copper-phosphorous | 714 | 8.4 P | 1083 |
| molybdenum-silicon | 2070 | 5.5 Si | 2625 |
| aluminum-silicon | 577 | 11.7 Si | 660 |

A method of forming a gas-metal eutectic and the direct bond in a single operation is to heat in a reactive atmosphere a metallic member which is superimposed on a substrate. For instance, metallic member 3 and ceramic substrate 4, shown in FIGS. 2a or 2b, are placed in a suitable oven including a reactive atmosphere, which at an elevated temperature forms an eutectic composition on the surfaces of the metallic member. Continued heating to a temperature between the eutectic temperature and the melting point of the metal causes the liquefaction of the eutectic which wets the substrate and forms a tenacious bond therewith upon cooling. Thus, where the metallic member is copper and the reactive atmosphere includes oxygen, the eutectic is a mixture of copper and copper oxide. Where the metallic member is nickel and the reactive gas is phosphorus, the eutectic mixture is nickel and nickel phosphide. In general, the amount of reactive gas necessary to produce tenacious bonds is dependent, in part, upon the thickness of the metallic and ceramic members and the times and temperatures required to form the eutectic. However, if the partial pressure of the reactive gas is too high, all of the metal may react with the reactive gas and form, for example, an oxide, phosphide, sulfide, etc., which prevents the formation of the eutectic melt. It is to be noted that in accordance with this method the eutectic forms on all surfaces of the metallic member. For example, when bonding copper to ceramics for use in hybrid electronic circuits, the use of the reactive atmosphere causes a coating of copper oxide to be formed on the copper, thus necessitating an oxide removal step.

A more detailed and complete description of the aforedescribed process may be found in the aforementioned U.S. Pat. No. 3,766,634.

A more convenient method of direct bonding a metal to a metallic or ceramic substrate is described in the previously mentioned U.S. Pat. No. 3,994,430.

In accordance with this method, the metal is selectively reacted with a bonding agent so that upon heating, the eutectic forms only on the treated surfaces. Table II lists metals and suitable bonding agents, as well as other properties thereof.

TABLE II

Metal and Agents for Direct Bonding

| Metal | Bonding Agent | Metal Melting Point (°C.) | Eutectic Temp (°C.) | Atomic Percent Bonding Agent at Eutectic |
|---|---|---|---|---|
| iron | oxygen | 1534 | 1523 | 0.56 |
| copper | oxygen | 1083 | 1065 | 1.54 |
| chromium | oxygen | 1850 | 1800 | 2.00 |
| chromium | sulfur | 1850 | 1550 | 3.5 |
| copper | phosphorus | 1083 | 714 | 15.7 |
| nickel | oxygen | 1453 | 1438 | 0.87 |
| nickel | phosphorus | 1453 | 880 | 19.0 |
| molybdenum | silicon | 2625 | 2070 | 16.5 |
| silver | sulfur | 960.5 | 906 | 5.8 |
| silver | phosphorus | 960.5 | 878 | 3.4 |
| copper | sulfur | 1083 | 1067 | 1.5 |
| cobalt | oxygen | 1495 | 1451 | 0.23 |
| aluminum | silicon | 660 | 577 | 11.3 | cobalt is expressed in weight percent

A copper-copper oxide eutectic, for example, may be formed by selective growing of a thin layer of copper oxide on the copper. The oxide may be formed on the copper surface which is in direct contact with the substrate; e.g., on interchannel regions 2. It is significant to note that, if desired, the oxide may also be grown on the outer surface of the metallic member. Upon heating, a certain amount of oxide diffuses through the relatively thin copper by what is believed to be solid state diffusion and reaches the inner surface which is in contact with the substrate. It is also possible that certain capillary paths of the liquid melt pass through the copper when the temperature exceeds the eutectic temperature, thus permitting a small amount of the melt to directly reach the inner surface of the copper. Since the copper and the substrate are abutted at the interface, only a small amount of melt is necessary to fill the interface. Subsequently, upon cooling, a bond is formed. When oxidizing the upper surface, preferably a somewhat thicker layer of oxide is provided than the oxide used on interchannel region 2.

When the direct bonding method described above is practiced with copper and copper oxide, the thin oxide layer may be formed on the copper surface in several ways. For example, it may be thermally grown, formed by anodization, or chemically grown. Chemical growth is possible by utilizing oxidizing compounds available from Ethone Inc. (New Haven, Conn.) under the names Ebonol C and MB-08125. Ebonol C is a particulate and must be mixed with a binder/carrier for convenient handling. The compound MB-08125 is a liquid and is preferred for selectively oxidizing copper.

To form the direct bond, the metal which had been previously reacted with a bonding agent and the selected substrate are introduced into a furnace with an inert atmosphere such a nitrogen. The temperature is raised to at least the eutectic temperature, but below the melt point of the metal, so that the eutectic liquifies and bonds the metal to the substrate upon cooling. This process may also be practiced successfully in vacuum.

For metals having a sufficient quantity of bonding agent dissolved or precipitated therein, it is merely necessary to heat the metal in an inert atmosphere to the eutectic temperature to achieve satisfactory bonding. For example, some electrolyte tough pitch copper contains a sufficient amount of oxygen to permit it to be bonded directly to ceramics such as alumina or beryllia without the addition of further oxygen. Suitable iron materials also exist.

The metal-to-metal bond illustrated in FIG. 5 may be formed for example, by applying a bonding agent (such as Ebonol C and a binder, if the metals are copper) in the manner described hereintofore to at least one of the metallic members and heating the assembly to at least the eutectic temperature but below the melting point of the metal.

It is realized by those skilled in the art that not all metals will bond to all substrates. Furthermore, it is known that a bonding agent which will bond a given metal to a given substrate may not bond that metal to other substrates. For example, utilizing oxygen as the bonding agent to bond copper to a ceramic substrate works very well. However, oxygen will not function as a bonding agent to bond copper to stainless steel. Sulfur will effectively function as a bonding agent between copper and stainless steel; however, sulfur will not act as a bonding agent between copper and a ceramic substrate. The reasons for this behavior are not fully understood.

From the foregoing, it may be appreciated that the channels formed in the metallic member or the substrate provide effective means for venting gases from the metal-substrate interface. Thus, the present invention permits the fabrication of large area, blister-free, direct bonded metal-to-substrate assemblies. Due to the absence of blisters, such assembly has flat surfaces for conveniently and reliably soldering the electronic components thereon. Moreover, since the metal is in continuous intimate contact with the substrate, and the intermediate layer is essentially non-existent, the assembly exhibits superior thermal and electrical conductivity at the metal-substrate interface.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. A large area, blister-free assembly formed by direct bonding a metal to a substrate comprising:
   a first substrate having two major surfaces; and
   a first metallic sheet direct bonded to one of the major surfaces of said first substrate and having a thickness of less than about 0.010 inch, the interface between said first metallic sheet and said first substrate including an eutectic composition, at least one of the surfaces forming said interface including therein a first plurality of channels providing means for venting gases from said interface during the direct bonding operation.

2. The assembly of claim 1 including a second metallic sheet direct bonded to the other major surface of said first substrate, the interface between said metallic sheet and said first substrate including an eutectic composition, at least one of the surfaces forming the last-mentioned interface including therein a second plurality of channels providing means for venting gases from the last-mentioned interface during the direct bonding operation.

3. The assembly of claim 2 wherein said first and second metallic sheets each comprises a metal selected from the group consisting of aluminum, copper, nickel, cobalt, iron, silver, chromium, and molybdenum.

4. The assembly of claim 3 wherein said first and second pluralities of channels are formed in said first and second metallic members, respectively.

5. The assembly of claim 4 wherein said first substrate comprises a metal.

6. The assembly of claim 4 wherein said first substrate comprises a ceramic.

7. The assembly of claim 6 wherein said ceramic comprises a material selected from the group consisting of alumina (Al$_2$O$_3$), beryllia (BeO), zinc oxide (ZnO), silicon dioxide (SiO$_2$), and barium titanate (BatiO$_3$).

8. The assembly of claim 2, wherein said first and second pluralities of channels are formed in each of the major surfaces of said first substrate.

9. The assembly of claim 8 wherein said first substrate comprises a ceramic.

10. The assembly of claim 9 wherein said ceramic comprises a material selected from the group consisting of alumina (Al$_2$O$_3$), beryllia (BeO), zinc oxide (ZnO), silicon dioxide (SiO$_2$), and barium titanate (BaTiO$_3$).

11. The assembly of claim 9 wherein said first and second metallic sheets each comprises a metal selected from the group consisting of aluminum, copper, nickel, cobalt, iron, silver, chromium, and molybdenum.

12. The assembly of claim 2 including a second substrate direct bonded to the outer surface of said first metallic sheets, the interface between said second substrate and said first metallic sheet including an eutectic composition, at least one of the surfaces forming the last-mentioned interface including therein a third plurality of channels providing means for venting gases from the last-mentioned interface.

13. The assembly of claim 12 wherein said first metallic comprises a metal selected from the group consisting of aluminum, copper, nickel, cobalt, iron, silver, chromium, and molybdenum.

14. The assembly of claim 13 wherein said first and third pluralities of channels are formed on each of the surfaces of said first metallic sheet forming an interface with said first and second substrates, respectively.

15. The assembly of claim 13 wherein said first and second substrates each comprises a ceramic.

16. The assembly of claim 15 wherein said ceramic comprises a material selected from the group consisting of alumina (Al$_2$O$_3$), beryllia (BeO), zinc oxide (ZnO), silicon dioxide (SiO$_2$), and barium titanate (BaTiO$_3$).

17. The assembly of claim 16 wherein said first and third pluralities of channels are formed on each of the major surfaces of said first and second substrates forming an interface with said first metallic sheet.

18. The assembly of claim 1 wherein said first metallic sheet comprises copper, said first substrate comprises a ceramic selected from the group consisting of alumina (Al$_2$O$_3$) and beryllia (BeO), and wherein said first plurality of channels is photoetched on the inner surface of said first metallic sheet.

19. In a method for direct bonding a metal sheet to a substrate wherein said metal sheet has a thickness of less than about 0.010 inch, said method being of the type employing a bonding agent compatible with said substrate so as to form an eutectic with said metal sheet, said eutectic consisting predominantly of said metal sheet and exhibiting an eutectic temperature lower than the melting point of said metal sheet such that heating said metal sheet having an eutectic formed thereon, while said metal sheet is in close contact with said substrate, to at least the eutectic temperature but below the melting point of said metal sheet causes said eutectic to wet said substrate and form a direct bond therewith upon cooling, the improvement comprising the step of:
   forming a plurality of channels in at least one of the surfaces forming said direct bond, said channels providing means for venting gases from the interface between said metal sheet and said substrate.

20. The method of claim 19 wherein said metal sheet comprises one of the group consisting of aluminum, copper, nickel, cobalt, iron, silver, chromium, and molybdenum.

21. The method of claim 20 wherein said substrate comprises a metal.

22. The method of claim 20 wherein said substrate comprises a ceramic.

23. The method of claim 22 wherein said ceramic comprises a material selected from the group consisting of alumina (Al$_2$O$_3$), beryllia (BeO), zinc oxide (ZnO), silicon dioxide (SiO$_2$), and barium titanate (BaTiO$_3$).

24. The method of claim 23 wherein said channels are formed by being photoetched in said metal sheet.

25. The method of claim 23 wherein said channels are formed in said ceramic substrate.

26. The methods of claims 24 or 25 wherein said eutectic is formed by heating said metal sheet in a reactive atmosphere which includes said bonding agent.

27. The method of claim 26 wherein said metal sheet comprises copper and said reactive atmosphere comprises oxygen.

28. The method of claim 26 wherein said metal sheet comprises electrolyte tough pitch copper having sufficient oxygen dissolved or precipitated therein to form said eutectic upon heating.

29. The method of claims 24 or 25 wherein said direct bonding agent is selectively applied to said metal sheet and wherein said eutectic is formed upon heating said metal sheet and said bonding agent in an inert atmosphere.

30. The method of claim 29 wherein said bonding agent is applied to the side of said metal sheet opposite the side which forms the interface.

31. The method of claim 30 wherein said metal sheet comprises copper and said bonding agent comprises a chemical oxidizing agent.

32. The method of claim 29 wherein said metal sheet comprises electrolyte tough pitch copper having a sufficient quantity of oxygen dissolved or precipitated therein to form said eutectic upon heating.

* * * * *